(12) United States Patent
Chen et al.

(10) Patent No.: US 7,683,599 B2
(45) Date of Patent: Mar. 23, 2010

(54) VOLTAGE CONTROL CIRCUITS

(75) Inventors: Hisn-Kuang Chen, Taipei County (TW); Yi-Bin Hsieh, Taipei County (TW); Che-Wei Hsu, Changhua County (TW)

(73) Assignee: Princeton Technology Corporation, Taipei County (TW)

( * ) Notice: Subject to any disclaimer, the term of this patent is extended or adjusted under 35 U.S.C. 154(b) by 347 days.

(21) Appl. No.: 11/802,880

(22) Filed: May 25, 2007

(65) Prior Publication Data
US 2008/0143306 A1    Jun. 19, 2008

(30) Foreign Application Priority Data
Dec. 15, 2006    (TW) .............................. 95147294 A

(51) Int. Cl.
*G05F 3/04*    (2006.01)
(52) U.S. Cl. ..................................... 323/312
(58) Field of Classification Search ................. 323/312, 323/313, 314, 315, 316
See application file for complete search history.

(56) References Cited

U.S. PATENT DOCUMENTS 3,689,752 A    9/1972    Barrie
5,717,360 A * 2/1998    Vu et al. ...................... 330/253
5,734,296 A * 3/1998    Dotson et al. ............... 330/253

FOREIGN PATENT DOCUMENTS

CN    1669217(A)    9/2005

* cited by examiner

*Primary Examiner*—Adolf Berhane
(74) *Attorney, Agent, or Firm*—Muncy, Geissler, Olds & Lowe, PLLC

(57) ABSTRACT

A voltage control circuit is provided. The voltage control circuit comprises a control voltage source, a current generating unit, and an output voltage generating unit. The control voltage source inputs a single end control voltage. The current generating unit coupled to the control voltage source and a ground generates a first current according to the single end control voltage. The output voltage generating unit coupled to the current generating unit, receives a reference voltage, and generates a first output voltage and a second output voltage according to the first current and the reference voltage. A value of the first output voltage is greater than a value of the second output voltage.

20 Claims, 3 Drawing Sheets

VOLTAGE CONTROL CIRCUITS

CROSS REFERENCE TO RELATED APPLICATIONS

This application claims the benefit of Taiwan application Serial No. 95147294 filed Dec. 15, 2006, the subject matter of which is incorporated herein by reference.

BACKGROUND OF THE INVENTION

1. Field of the Invention

The invention relates to a voltage control circuit, and more particularly to a voltage control circuit of a variable gain amplifier circuit.

2. Description of the Related Art

A variable gain amplifier circuit generally comprises a multiplier, preferably a Gilbert cell, for amplifying an input signal. The variable gain amplifier circuit further comprises a voltage control circuit for controlling the multiplier, thus, the amplified input signal has the same polarity as an output signal. The voltage control circuit for a Gilbert cell typically comprises an input terminal and two output terminals. The voltage control circuit modulates the gain of the multiplier by control voltage generated by the two output terminals. During operation of the variable gain amplifier circuit, the control voltage generated by one of the two output terminals of the voltage control circuit must always be greater than that of the other output terminal. Thus, the polarity of the input signal of the multiplier is the same as the output signal, preventing abnormal operation.

FIG. 1(a) shows the output signal during normal operation of the variable gain amplifier circuit. One of the two control voltages generated by the voltage control circuit is always greater than the other control voltage, and the input and output signals of the multiplier have the same polarity, thus, the system output the normal output signal 11.

FIG. 1(b) shows the output signal when the variable gain amplifier circuit operates abnormally. The lower voltage exceeding the higher voltage suddenly at a time point T, results in the polarities of the input signal and the output signal are inverted at time point T, and an error signal is thus occurred. The system thus operates abnormally and outputs error output signal 12, complicating use of the variable gain amplifier circuit.

In a voltage control circuit, because a voltage source is immediately changed or the input voltage is not stable, the polarities of the voltage may run abnormally to make the whole circuit outputting wrong signal. So how to make the output voltage stable is a critical issue.

BRIEF SUMMARY OF THE INVENTION

An exemplary embodiment of a voltage control circuit comprises a control voltage source, a current generating unit, and an output voltage generating unit. The control voltage source inputs a single end control voltage. The current generating unit, coupled to the control voltage source and a ground, generates a first current according to the single end control voltage. The output voltage generating unit, coupled to the current generating unit, receives a reference voltage and generates a first output voltage and a second output voltage corresponding to the first current and the reference voltage. A value of the first output voltage is greater than a value of the second output voltage.

An exemplary embodiment of a variable gain amplifier circuit comprises a multiplier and a voltage control circuit coupled to the multiplier. The voltage control circuit comprises a control voltage source, a current generating unit, and an output voltage generating unit. The control voltage source inputs a single end control voltage. The current generating unit coupled to the control voltage source and a ground generates a first current according to the single end control voltage. The output voltage generating unit, coupled to the current generating unit, receives a reference voltage and generates a first output voltage and a second output voltage corresponding to the first current and the reference voltage. The multiplier amplifies an input signal according to the first output voltage and the second output voltage and outputs an output signal. The input signal and the output signal have the same polarity.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
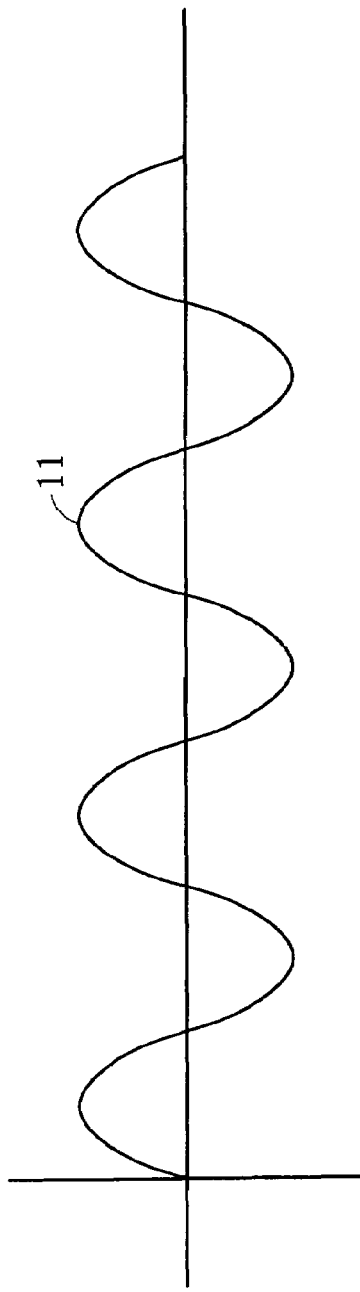
FIG. 1(a) shows the output signal of the variable gain amplifier circuit operating normally.
Figure 1B:
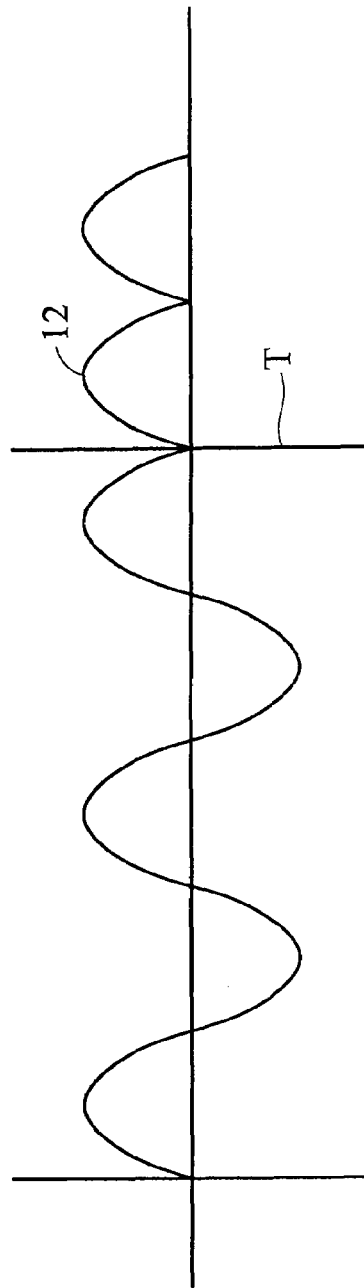
FIG. 1(b) shows the output signal of the variable gain amplifier circuit operating abnormally.
Figure 2:
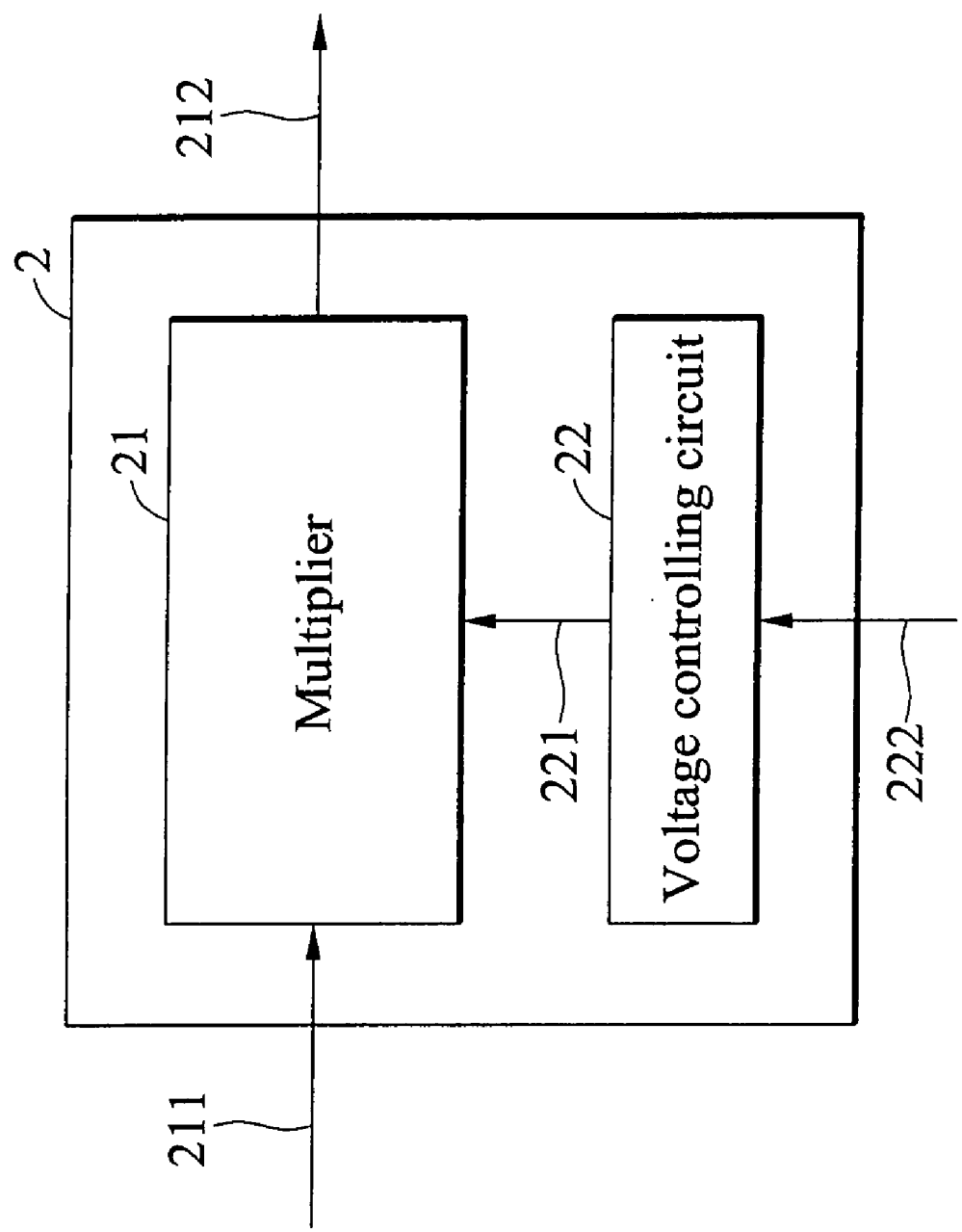
FIG. 2 shows an exemplary embodiment of a variable gain amplifier circuit.

Variable gain amplifier circuits are provided. In an exemplary embodiment of a variable gain amplifier circuit in FIG. 2, a variable gain amplifier circuit 2 comprises a multiplier 21 and a voltage control circuit 22 coupled to the multiplier 21. The multiplier 21 receives an input signal 211 and amplifies the input signal 211 according to control voltage 221 to generate an output signal 212. The voltage control circuit 22 generates the control voltage 221 according to input voltage 222 for controlling the multiplier 21 to amplify the input signal 211. The multiplier 21 may be implemented in a Gilbert cell. The invention is, however, not limited to this.

Figure 3:
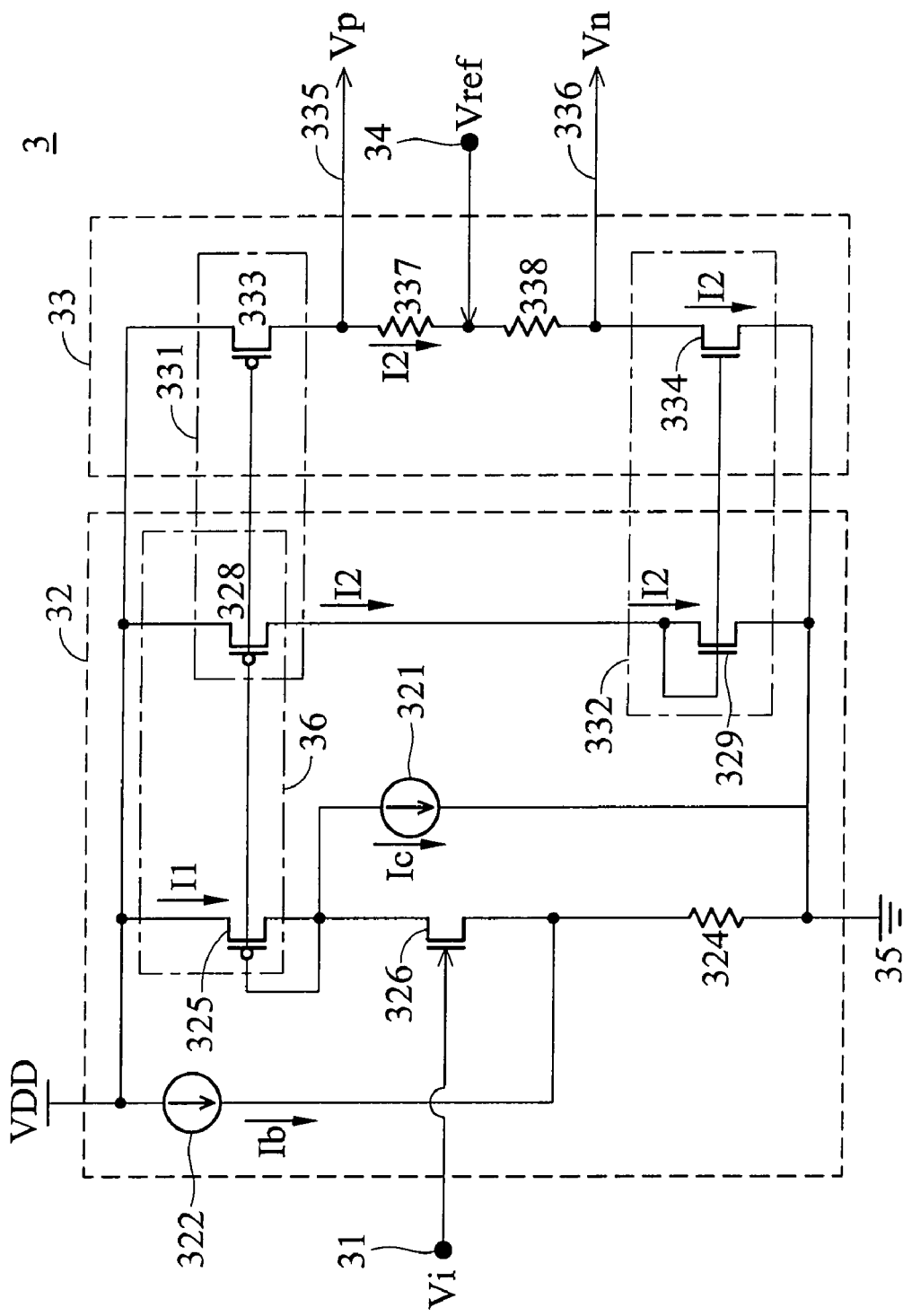
FIG. 3 shows an exemplary embodiment of a voltage control circuit.

FIG. 3 shows an exemplary embodiment of a voltage control circuit. Referring FIG. 3, the voltage control circuit 3 comprises a control voltage source 31, a current generating unit 32, an output voltage generating unit 33, a reference voltage source 34, and a ground 35. The control voltage source 31 is coupled to the current generating unit 32 and inputs single end control voltage Vi. In this embodiment, the single end control voltage Vi can be reference voltage or feedback control voltage of the output signal 212 of the variable gain amplifier circuit 2, the invention is, however, not limited to this.

The current generating unit 32 is coupled to the ground 35 and comprises a first current source 321, a second current source 322, a first resistor 324, a first P-type metal-oxide semiconductor (MOS) 325, a first N-type MOS 326, a second P-type MOS 328, a second N-type MOS 329, and a first current mirror 36. The first current source 321 is coupled to the gate and drain of the first P-type MOS 325 and the ground 35 to provide second current Ic. The second current source 322 is coupled to a first resistor 324 and the source of the first N-type MOS 326 to provide third current Ib. The gate of the first N-type MOS 326 is coupled to the control voltage source 31 to receive the single end control voltage Vi. The range of the single end control voltage Vi can be determined by the third current Ib and the first resistor 324.

The output voltage generating unit 33 comprises second and third current mirrors 331 and 332, a third P-type MOS 333, a third N-type MOS 334, first and second voltage output terminals 335 and 336, and second and third resistors 337 and 338. The drain of the second P-type MOS 328 is coupled to the drain of the second N-type MOS 329. The gate of the second P-type MOS 328 is coupled between the gates of the first P-type MOS 325 and third P-type MOS 333. The source of the second P-type MOS 328 is coupled to sources of the first P-type MOS 325 and the third P-type MOS 333. The gate and drain of the second N-type MOS 329 is coupled to the gate of the third N-type MOS 334. The source of the second N-type MOS 329 is coupled to the source of the third N-type MOS 334 and the ground 35. The connection between the first P-type MOS 325 and second P-type MOS 328 forms the first current mirror 36 which generates first current I2 according to input current I1. The value of the first current I2 is the value of the input current I1 multiplied by a constant. The connection between the second P-type MOS 328 and the third P-type MOS 333 forms the second current mirror 331 which copies the first current I2 to the output voltage generating unit 33. The connection between the second N-type MOS 329 and the third N-type MOS 334 forms the third current mirror 332 which copies the first current I2 to the output voltage generating unit 33.

The first voltage output terminal 335 is coupled between the third P-type MOS 333 and the second resistor 337. The second voltage output terminal 336 is coupled between the third N-type MOS 334 and the third resistor 338. The reference voltage source 34 is coupled between the second and third resistors 337 and 338 and provides a reference voltage Vref. The first voltage output terminal 335 outputs the first output voltage Vp according to the reference voltage Vref, the first current I2, and the second resistor 337. The second voltage output terminal 336 outputs the second output voltage Vn according to the reference voltage Vref, the first current I2, and the third resistor 338. The value of the first output voltage Vp is equal to the sum of the values of the reference voltage Vref and the voltage generated by the first current I2 and the second resistor 337. The value of the second output voltage Vn is equal to the difference between the values of the reference voltage Vref and the voltage generated by the first current I2 and the third resistor 338. Because the source of first output voltage Vp and second output voltage Vn, the value of the first output voltage Vp is greater than that of the second output voltage Vn.

As described, the first output voltage and the second output voltage of the voltage control circuit are determined by the first current. In the invention, the first current remains stable, and will not be changed in different position in the circuit. Thus, the first and second output voltages also remain stable. Moreover, because the value of the first output voltage is equal to the sum of the values of the reference voltage and the voltage generated by the first current and the second resistor and the value of the second output voltage is equal to the difference between the values of the reference voltage and the voltage generated by the first current and the third resistor, the value of the first output voltage is always greater than that of the second output voltage. Accordingly, the multiplier completes amplifying the input signal according to the first and second output voltage, and the polarities of the input signal and the output signal are the same.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all Such modifications and similar arrangements.

What is claimed is:

1. A voltage control circuit comprising:
   a control voltage source for inputting a single end control voltage;
   a current generating unit coupled to the control voltage source and a ground for generating a first current according to the single end control voltage; and
   an output voltage generating unit coupled to the current generating unit for receiving a reference voltage and generating a first output voltage and a second output voltage according to the first current and the reference voltage;
   wherein a value of the first output voltage is greater than a value of the second output voltage.

2. The voltage control circuit as claimed in claim 1, wherein the current generating unit comprises a first current source coupled to the ground, a second current source and a first resistor coupled to the ground and the second current source;
   wherein the current generating unit generates an input current according to the single end control voltage, the first current source, the second current source, and the first resistor and generates the first current according to the input current.

3. The voltage control circuit as claimed in claim 2, wherein the second current source limits the single end control voltage inputted from the control voltage source.

4. The voltage control circuit as claimed in claim 2, wherein the current generating unit further comprises a first current mirror for generating the first current according to the input current.

5. The voltage control circuit as claimed in claim 4, wherein a value of the first current is a value of the input current multiplied by a constant.

6. The voltage control circuit as claimed in claim 1, wherein the output voltage generating unit comprises a second current mirror, a third current mirror, a first voltage output terminal, a second voltage output terminal, a second resistor coupled to a reference voltage source and the first voltage output terminal, and a third resistor coupled to the reference voltage source and the second voltage output terminal;
   wherein, the second current mirror copies the first current to the first voltage output terminal, and the third current mirror copies the first current to the second voltage output terminal; and
   wherein the first voltage output terminal outputs the first output voltage according to the reference voltage, the first current, and the second resistor, and the second voltage output terminal outputs the second output voltage according to the reference voltage, the first current, and the third resistor.

7. The voltage control circuit as claimed in claim 6, wherein a value of the second resistor is equal to a value of the third resistor.

8. The voltage control circuit as claimed in claim 6, wherein the value of the first output voltage is equal to the sum of a value of the reference voltage and a value of a voltage generated by the first current and the second resistor, and the value of the second output voltage is equal to the difference between the value of the reference voltage and a value of a voltage generated by the first current and the third resistor.

9. The voltage control circuit as claimed in claim 1, wherein a multiplier of a variable gain amplifier circuit comprises the voltage control circuit.

10. The voltage control circuit as claimed in claim 9, wherein the multiplier is implemented by a Gilbert cell.

11. A variable gain amplifier circuit comprising a multiplier and a voltage control circuit coupled to the multiplier, the voltage control circuit comprising:
  a control voltage source for inputting a single end control voltage;
  a current generating unit coupled to the control voltage source and a ground for generating a first current according to the single end control voltage; and
  an output voltage generating unit coupled to the current generating unit for receiving a reference voltage and generating a first output voltage and a second output voltage according to the first current and the reference voltage;
  wherein the multiplier amplifies an input signal according to the first output voltage and the second output voltage and outputs an output signal; and
  wherein the input signal and the output signal have the same polarity.

12. The variable gain amplifier circuit as claimed in claim 11, wherein a value of the first output voltage is greater than a value of the second output voltage.

13. The variable gain amplifier circuit as claimed in claim 11, wherein the current generating unit comprises a first current source coupled to the ground, a second current source, and a first resistor coupled to the ground and the second current source;
  wherein the current generating unit generates an input current according to the single end control voltage, the first current source, the second current source, and the first resistor and generates the first current according to the input current.

14. The variable gain amplifier circuit as claimed in claim 13, wherein the second current source limits the single end control voltage inputted from the control voltage source.

15. The variable gain amplifier circuit as claimed in claim 11, wherein the current generating unit further comprises a first current mirror for generating the first current according to the input current.

16. The variable gain amplifier circuit as claimed in claim 11, wherein a value of the first current is a value of the input current multiplied by a constant.

17. The variable gain amplifier circuit as claimed in claim 11, wherein the output voltage generating unit comprises a second current mirror, a third current mirror, a first voltage output terminal, a second voltage output terminal, a second resistor coupled to a reference voltage source and the first voltage output terminal, and a third resistor coupled to the reference voltage source and the second voltage output terminal;
  wherein, the second current mirror copies the first current to the first voltage output terminal, and the third current mirror copies the first current to the second voltage output terminal; and
  wherein the first voltage output terminal outputs the first output voltage according to the reference voltage, the first current, and the second resistor, and the second voltage output terminal outputs the second output voltage according to the reference voltage, the first current, and the third resistor.

18. The variable gain amplifier circuit as claimed in claim 17, wherein a value of the second resistor is equal to a value of the third resistor.

19. The variable gain amplifier circuit as claimed in claim 18, wherein the value of the first output voltage is equal to the sum of a value of the reference voltage and a value of a voltage generated by the first current and the second resistor, and the value of the second output voltage is equal to the difference between the value of the reference voltage and a value of a voltage generated by the first current and the third resistor.

20. The variable gain amplifier circuit as claimed in claim 11, wherein the multiplier is implemented by a Gilbert cell.

* * * * *